United States Patent
Kawarazaki

(10) Patent No.: US 10,658,250 B2
(45) Date of Patent: May 19, 2020

(54) LIGHT IRRADIATION TYPE HEAT TREATMENT METHOD AND HEAT TREATMENT APPARATUS

(71) Applicant: SCREEN HOLDINGS CO., LTD., Kyoto (JP)

(72) Inventor: Hikaru Kawarazaki, Kyoto (JP)

(73) Assignee: SCREEN HOLDINGS CO., LTD., Kyoto (JP)

(*) Notice: Subject to any disclaimer, the term of this patent is extended or adjusted under 35 U.S.C. 154(b) by 0 days.

(21) Appl. No.: 16/188,672

(22) Filed: Nov. 13, 2018

(65) Prior Publication Data

US 2019/0157168 A1  May 23, 2019

(30) Foreign Application Priority Data

Nov. 20, 2017 (JP) .................... 2017-222530

(51) Int. Cl.
*H01L 21/66* (2006.01)
*H01L 21/324* (2006.01)
(Continued)

(52) U.S. Cl.
CPC ............ *H01L 22/12* (2013.01); *H01L 21/324* (2013.01); *H01L 21/67115* (2013.01);
(Continued)

(58) Field of Classification Search
CPC ............... H01L 22/12; H01L 21/67115; H01L 21/67739; H01L 21/67248; H01L 21/68785
See application file for complete search history.

(56) References Cited

U.S. PATENT DOCUMENTS 5,997,175 A * 12/1999 Champetier ...... H01L 21/67248
219/405
6,849,931 B2 * 2/2005 Nakae ................. H01L 23/3107
257/672

(Continued)

FOREIGN PATENT DOCUMENTS

JP   2013-168462 A   8/2013
JP   2014-120497 A   6/2014
(Continued)

OTHER PUBLICATIONS

Taiwanese Office Action issued in corresponding Taiwanese Patent Application No. 107139821, dated Jun. 11, 2019, with partial English Translation from the Japanese Translation of the Taiwanese Office Action.

(Continued)

*Primary Examiner* — William Coleman
(74) *Attorney, Agent, or Firm* — McDermott Will & Emery LLP

(57) ABSTRACT

A front surface of a semiconductor wafer is momentarily heated by irradiation with a flash of light from flash lamps. An upper radiation thermometer and a high-speed radiation thermometer unit measure a temperature of the front surface of the semiconductor wafer after the irradiation with the flash of light. The temperature data are sequentially accumulated, so that a temperature profile is acquired. An analyzer determines the highest measurement temperature of the semiconductor wafer subjected to the flash irradiation from the temperature profile to calculate a jump distance of the semiconductor wafer from a susceptor, based on the highest measurement temperature. If the calculated jump distance is greater than a predetermined threshold value, there is a high probability that the semiconductor wafer is (Continued)

significantly out of position, so that the transport of the semiconductor wafer to the outside is stopped.

4 Claims, 11 Drawing Sheets

(51) Int. Cl.
    *H01L 21/67*      (2006.01)
    *H01L 21/677*      (2006.01)
    *H01L 21/687*      (2006.01)

(52) U.S. Cl.
    CPC .. *H01L 21/67248* (2013.01); *H01L 21/67739* (2013.01); *H01L 21/6875* (2013.01); *H01L 21/68785* (2013.01)

(56) References Cited

U.S. PATENT DOCUMENTS

| | | | | |
|---|---|---|---|---|
| 7,756,403 | B2 * | 7/2010 | Seki | H01L 21/324 |
| | | | | 392/407 |
| 7,763,553 | B2 * | 7/2010 | Ito | H01L 21/67115 |
| | | | | 219/390 |
| 8,057,602 | B2 * | 11/2011 | Koelmel | H01L 21/67115 |
| | | | | 118/728 |
| 8,145,046 | B2 * | 3/2012 | Kiyama | H01L 21/67115 |
| | | | | 118/725 |
| 8,173,937 | B2 * | 5/2012 | Yokouchi | F27B 5/18 |
| | | | | 219/411 |
| 2005/0236395 | A1 | 10/2005 | Timans et al. | |
| 2013/0078822 | A1 | 3/2013 | Yokouchi | |
| 2013/0206747 | A1 * | 8/2013 | Nishide | H05B 3/0047 |
| | | | | 219/538 |
| 2014/0169772 | A1 * | 6/2014 | Abe | H01L 21/6875 |
| | | | | 392/418 |
| 2017/0178979 | A1 * | 6/2017 | Furukawa | G01J 5/0007 |
| 2017/0194177 | A1 * | 7/2017 | Cibere | H01L 21/324 |

FOREIGN PATENT DOCUMENTS

| | | |
|---|---|---|
| TW | I496215 B | 8/2015 |
| TW | 201734445 A | 10/2017 |
| WO | 2017/116687 A1 | 7/2017 |

OTHER PUBLICATIONS

Korean Office Action issued in corresponding Korean Patent Application No. 10-2018-0142506, dated Jan. 23, 2020, with English translation.

* cited by examiner

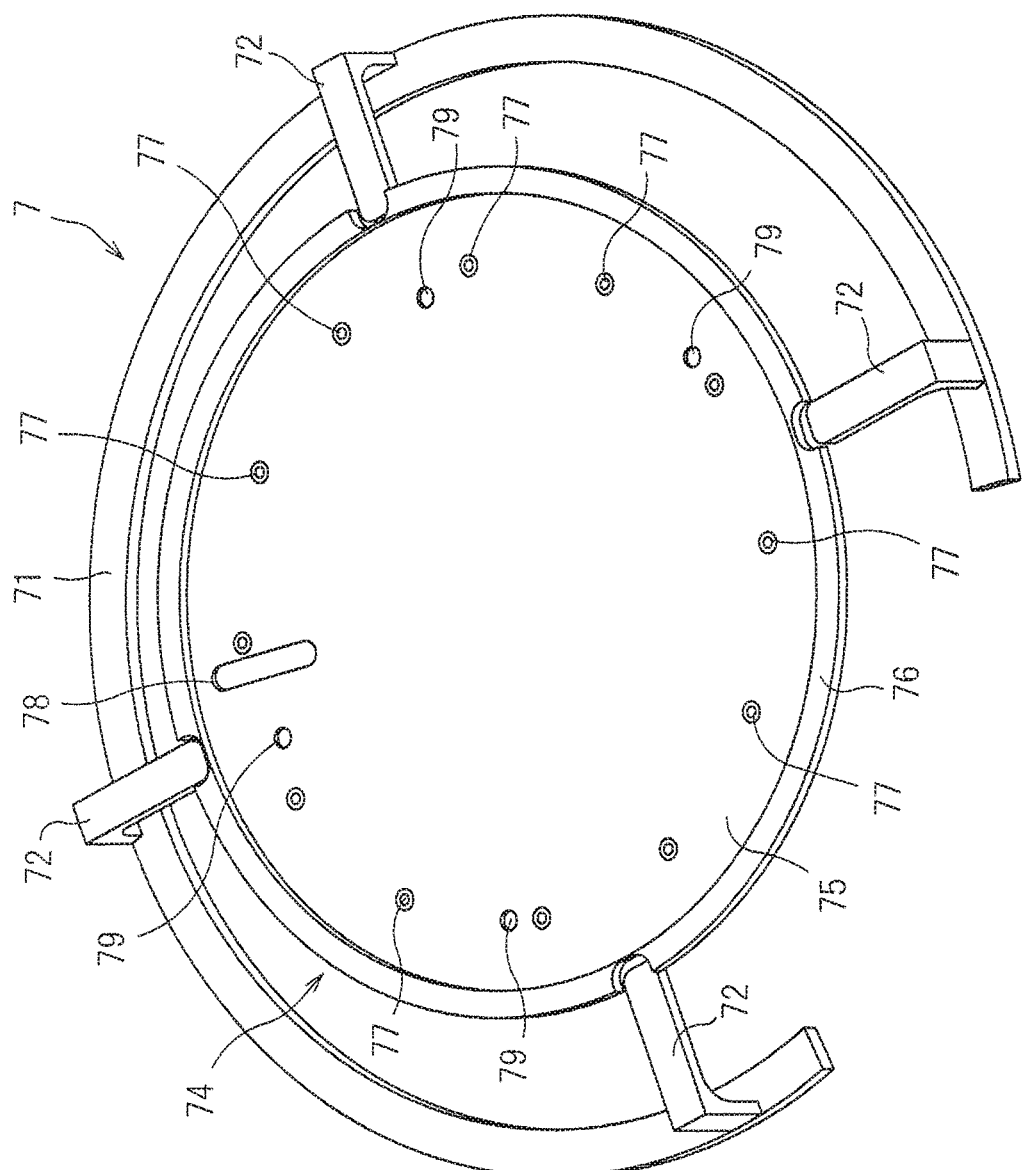
F I G . 2

F I G . 6
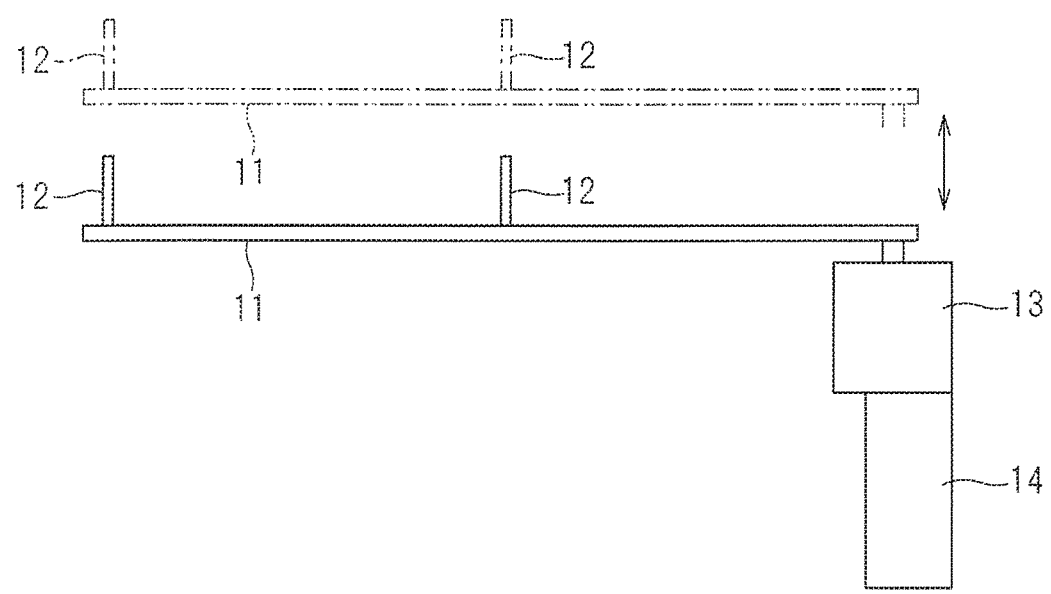

LIGHT IRRADIATION TYPE HEAT TREATMENT METHOD AND HEAT TREATMENT APPARATUS

BACKGROUND OF THE INVENTION

Field of the Invention

The present invention relates to a heat treatment method and a heat treatment apparatus which irradiate a thin plate-like precision electronic substrate (hereinafter referred to simply as a "substrate") such as a semiconductor wafer with a flash of light to heat the substrate.

Description of the Background Art

In the process of manufacturing a semiconductor device, impurity doping is an essential step for forming a pn junction in a semiconductor wafer. At present, it is common practice to perform impurity doping by an ion implantation process and a subsequent annealing process. The ion implantation process is a technique for causing ions of impurity elements such as boron (B), arsenic (As) and phosphorus (P) to collide against the semiconductor wafer with high acceleration voltage, thereby physically implanting the impurities into the semiconductor wafer. The implanted impurities are activated by the subsequent annealing process. When annealing time in this annealing process is approximately several seconds or longer, the implanted impurities are deeply diffused by heat. This results in a junction depth much greater than a required depth, which might constitute a hindrance to good device formation.

In recent years, attention has been given to flash lamp annealing (FLA) that is an annealing technique for heating a semiconductor wafer in an extremely short time. The flash lamp annealing is a heat treatment technique in which xenon flash lamps (the term "flash lamp" as used hereinafter refers to a "xenon flash lamp") are used to irradiate a surface of a semiconductor wafer with a flash of light, thereby raising the temperature of only the surface of the semiconductor wafer implanted with impurities in an extremely short time (several milliseconds or less).

The xenon flash lamps have a spectral distribution of radiation ranging from ultraviolet to near-infrared regions. The wavelength of light emitted from the xenon flash lamps is shorter than that of light emitted from conventional halogen lamps, and approximately coincides with a fundamental absorption band of a silicon semiconductor wafer. Thus, when a semiconductor wafer is irradiated with a flash of light emitted from the xenon flash lamps, the temperature of the semiconductor wafer can be raised rapidly, with only a small amount of light transmitted through the semiconductor wafer. Also, it has turned out that flash irradiation, that is, the irradiation of a semiconductor wafer with a flash of light in an extremely short time of several milliseconds or less allows a selective temperature rise only near the surface of the semiconductor wafer. Therefore, the temperature rise in an extremely short time with the xenon flash lamps allows only the activation of impurities to be achieved without deep diffusion of the impurities.

A heat treatment apparatus employing such xenon flash lamps momentarily irradiates a front surface of a semiconductor wafer with a flash of light having ultrahigh energy. Thus, the temperature of the front surface of the semiconductor wafer is raised rapidly for a very short period of time, whereas the temperature of a back surface thereof does not rise so high, so that a temperature gradient occurs from the front surface to the back surface. This causes abrupt thermal expansion only near the front surface of the semiconductor wafer, so that the semiconductor wafer becomes deformed abruptly in such a manner that the upper surface of the semiconductor wafer is warped to become a convex surface. As a result, a phenomenon in which the semiconductor wafer vibrates on a susceptor that supports the semiconductor wafer or jumps up from the susceptor has been observed (for example, in U.S. Patent Application Publication No. 2013/0206747 and U.S. Patent Application Publication No. 2014/0169772).

There arises a problem such that cracking occurs in a semiconductor wafer when the semiconductor wafer vibrates severely or jumps up greatly from the susceptor to fall off. Even if such wafer cracking does not result, there are cases in which the semiconductor wafer, once jumping up, falls onto the susceptor to be displaced (misaligned) from its original set position. A large displacement of the semiconductor wafer from its original set position causes transport trouble, and might lead to not only breakage of the semiconductor wafer but also a hindrance to a transport robot in some cases.

To solve these problems, there has been a need for a technique for monitoring the behavior of the semiconductor wafer subjected to flash irradiation. For example, it is contemplated that a high-speed camera is provided in a chamber that receives a semiconductor wafer therein to image the behavior of the semiconductor wafer subjected to the flash irradiation, so that the imaged behavior is observed.

However, such a high-speed camera is costly. This not only leads to an increase in costs of the apparatus but also gives rise to a problem such that the analysis of captured image data is a complicated process. Further, there is a need to obtain space for placement of the high-speed camera in the chamber.

SUMMARY

The present invention is intended for a method of heating a substrate by irradiating the substrate with a flash of light.

According to one aspect of the present invention, the method comprises the steps of: (a) irradiating a front surface of a substrate supported by a susceptor in a chamber with a flash of light from a flash lamp; (b) measuring a temperature of the front surface of the substrate at least after the irradiation with the flash of light to acquire a temperature profile; and (c) analyzing a behavior of the substrate, based on the temperature profile acquired in the step (b).

This method is capable of quickly grasping the behavior of the substrate subjected to the flash irradiation with a simplified configuration without the use of a costly imaging mechanism and the like.

Preferably, transport of the substrate out of the chamber is stopped when the jump distance of the substrate calculated in the step (c) is greater predetermined threshold value.

This prevents transport trouble resulting from the displacement of the substrate.

The present invention is also intended for a heat treatment apparatus for heating a substrate by irradiating the substrate with a flash of light.

According to another aspect of the present invention, the heat treatment apparatus comprises: a chamber for receiving a substrate therein; a susceptor for placing and supporting the substrate thereon in the chamber; a flash lamp for irradiating the substrate supported by the susceptor with a flash of light; a temperature measuring part for measuring a temperature of a front surface of the substrate; and an analyzer for analyzing a behavior of the substrate, based on a temperature profile acquired from the temperature of the front surface of the substrate measured by the temperature measuring part at least after the irradiation with the flash of light.

This heat treatment apparatus is capable of quickly grasping the behavior of the substrate subjected to the flash irradiation with a simplified configuration without the use of a costly imaging mechanism and the like.

Preferably, the heat treatment apparatus further comprises a controller that stops transport of the substrate out of the chamber when the jump distance of the substrate calculated by the analyzer is greater than a predetermined threshold value.

This prevents transport trouble resulting from the displacement of the substrate.

It is therefore an object of the present invention to quickly grasp the behavior of a substrate subjected to flash irradiation with a simplified configuration.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a perspective view showing the entire external appearance of a holder;

FIG. 6 is a side view of the transfer mechanism;

DESCRIPTION OF THE PREFERRED EMBODIMENTS

A preferred embodiment according to the present invention will now be described in detail with reference to the drawings.

Figure 1:
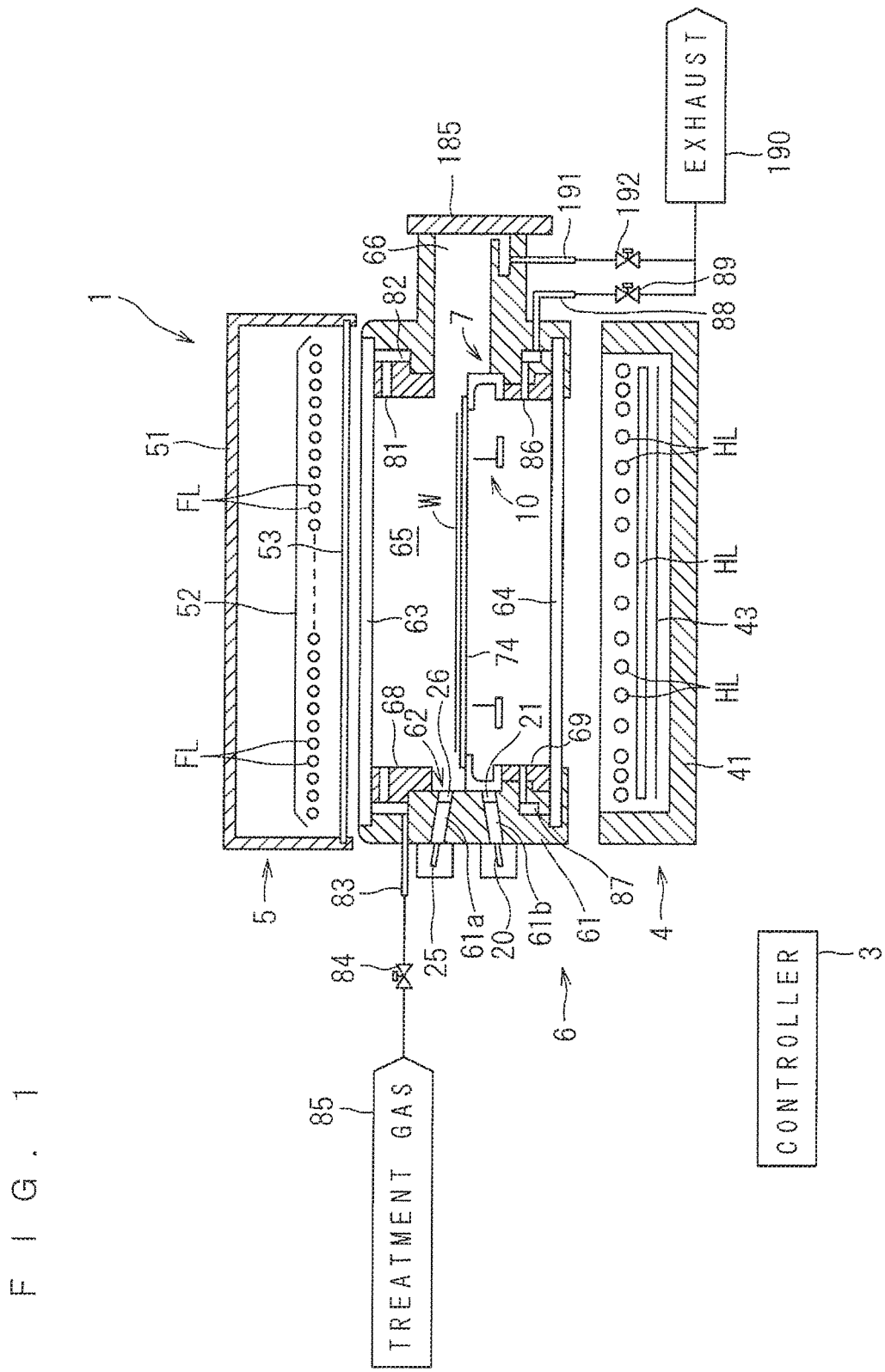
FIG. 1 is a longitudinal sectional view showing a configuration of a heat treatment apparatus according to the present invention.

FIG. 1 is a longitudinal sectional view showing a configuration of a heat treatment apparatus 1 according to the present invention. The heat treatment apparatus 1 of FIG. 1 is a flash lamp annealer for irradiating a disk-shaped semiconductor wafer W serving as a substrate with flashes of light to heat the semiconductor wafer W. The size of the semiconductor wafer W to be treated is not particularly limited. For example, the semiconductor wafer W to be treated has a diameter of 300 mm and 450 mm (in the present preferred embodiment, 300 mm). The semiconductor wafer W prior to the transport into the heat treatment apparatus 1 is implanted with impurities. The heat treatment apparatus 1 performs a heating treatment on the semiconductor wafer W to thereby activate the impurities implanted in the semiconductor wafer W. It should be noted that the dimensions of components and the number of components are shown in exaggeration or in simplified form, as appropriate, in FIG. 1 and the subsequent figures for the sake of easier understanding.

The heat treatment apparatus 1 includes a chamber 6 for receiving a semiconductor wafer W therein, a flash heating part 5 including a plurality of built-in flash lamps FL, and a halogen heating part 4 including a plurality of built-in halogen lamps HL. The flash heating part 5 is provided over the chamber 6, and the halogen heating part 4 is provided under the chamber 6. The heat treatment apparatus 1 further includes a holder 7 provided inside the chamber 6 and for holding a semiconductor wafer W in a horizontal attitude, and a transfer mechanism 10 provided inside the chamber 6 and for transferring a semiconductor wafer W between the holder 7 and the outside of the heat treatment apparatus 1. The heat treatment apparatus 1 further includes a controller 3 for controlling operating mechanisms provided in the halogen heating part 4, the flash heating part 5, and the chamber 6 to cause the operating mechanisms to heat-treat a semiconductor wafer W.

The chamber 6 is configured such that upper and lower chamber windows 63 and 64 made of quartz are mounted to the top and bottom, respectively, of a tubular chamber side portion 61. The chamber side portion 61 has a generally tubular shape having an open top and an open bottom. The upper chamber window 63 is mounted to block the top opening of the chamber side portion 61, and the lower chamber window 64 is mounted to block the bottom opening thereof. The upper chamber window 63 forming the ceiling of the chamber 6 is a disk-shaped member made of quartz, and serves as a quartz window that transmits flashes of light emitted from the flash heating part 5 therethrough into the chamber 6. The lower chamber window 64 forming the floor of the chamber 6 is also a disk-shaped member made of quartz, and serves as a quartz window that transmits light emitted from the halogen heating part 4 therethrough into the chamber 6.

An upper reflective ring 68 is mounted to an upper portion of the inner wall surface of the chamber side portion 61, and a lower reflective ring 69 is mounted to a lower portion thereof. Both of the upper and lower reflective rings 68 and 69 are in the form of an annular ring. The upper reflective ring 68 is mounted by being inserted downwardly from the top of the chamber side portion 61. The lower reflective ring 69, on the other hand, is mounted by being inserted upwardly from the bottom of the chamber side portion 61 and fastened with screws not shown. In other words, the upper and lower reflective rings 68 and 69 are removably mounted to the chamber side portion 61. An interior space of the chamber 6, i.e. a space surrounded by the upper chamber window 63, the lower chamber window 64, the chamber side portion 61, and the upper and lower reflective rings 68 and 69, is defined as a heat treatment space 65.

A recessed portion 62 is defined in the inner wall surface of the chamber 6 by mounting the upper and lower reflective rings 68 and 69 to the chamber side portion 61. Specifically, the recessed portion 62 is defined which is surrounded by a middle portion of the inner wall surface of the chamber side portion 61 where the reflective rings 68 and 69 are not mounted, a lower end surface of the upper reflective ring 68, and an upper end surface of the lower reflective ring 69. The recessed portion 62 is provided in the form of a horizontal annular ring in the inner wall surface of the chamber 6, and surrounds the holder 7 which holds a semiconductor wafer W. The chamber side portion 61 and the upper and lower reflective rings 68 and 69 are made of a metal material (e.g., stainless steel) with high strength and high heat resistance.

The chamber side portion 61 is provided with a transport opening (throat) 66 for the transport of a semiconductor wafer W therethrough into and out of the chamber 6. The transport opening 66 is openable and closable by a gate valve 185. The transport opening 66 is connected in communication with an outer peripheral surface of the recessed portion 62. Thus, when the transport opening 66 is opened by the gate valve 185, a semiconductor wafer W is allowed to be transported through the transport opening 66 and the recessed portion 62 into and out of the heat treatment space 65. When the transport opening 66 is closed by the gate valve 185, the heat treatment space 65 in the chamber 6 is an enclosed space.

The chamber side portion 61 is further provided with a through hole 61a and a through hole 61b both bored therein. The through hole 61a is a cylindrical hole for directing infrared radiation emitted from the upper surface of a semiconductor wafer W held by a susceptor 74 to be described later therethrough to an upper radiation thermometer 25. The through hole 61b is a cylindrical hole for directing infrared radiation emitted from the lower surface of the semiconductor wafer W therethrough to a lower radiation thermometer 20. The through hole 61a and the through hole 61b are inclined with respect to a horizontal direction so that the longitudinal axes (axes extending in respective directions in which the through holes 61a and 61b extend through the chamber side portion 61) of the through holes 61a and 61b intersect main surfaces of the semiconductor wafer W held by the susceptor 74. A transparent window 26 made of calcium fluoride material transparent to infrared radiation in a wavelength range measurable with the upper radiation thermometer 25 is mounted to an end portion of the through hole 61a which faces the heat treatment space 65. The upper radiation thermometer 25 receives infrared radiation emitted from the upper surface of the semiconductor wafer W through the transparent window 26 to measure the temperature of the upper surface of the semiconductor wafer W, based on the intensity of the infrared radiation. A transparent window 21 made of barium fluoride material transparent to infrared radiation in a wavelength range measurable with the lower radiation thermometer 20 is mounted to an end portion of the through hole 61b which faces the heat treatment space 65. The lower radiation thermometer 20 receives infrared, radiation emitted from the lower surface of the semiconductor wafer W through the transparent window 21 to measure the temperature of the lower surface of the semiconductor wafer W, based on the intensity of the infrared radiation.

At least one gas supply opening 81 for supplying a treatment gas therethrough into the heat treatment space 65 is provided in an upper portion of the inner wall of the chamber 6. The gas supply opening 81 is provided above the recessed portion 62, and may be provided in the upper reflective ring 68. The gas supply opening 81 is connected in communication with a gas supply pipe 83 through a buffer space 82 provided in the form of an annular ring inside the side wall of the chamber 6. The gas supply pipe 83 is connected to a treatment gas supply source 85. A valve 84 is inserted at some midpoint in the gas supply pipe 83. When the valve 84 is opened, the treatment gas is fed from the treatment gas supply source 85 to the buffer space 82. The treatment gas flowing in the buffer space 82 flows in a spreading manner within the buffer space 82 which is lower in fluid resistance than the gas supply opening 81, and is supplied through the gas supply opening 81 into the heat treatment space 65. Examples of the treatment gas usable herein include inert gases such as nitrogen gas ($N_2$), reactive gases such as hydrogen ($H_2$) and ammonia ($NH_3$), and mixtures of these gases (although nitrogen gas is used in this preferred embodiment).

At least one gas exhaust opening 86 for exhausting a gas from the heat treatment space 65 is provided in a lower portion of the inner wall of the chamber 6. The gas exhaust opening 86 is provided below the recessed portion 62, and may be provided in the lower reflective ring 69. The gas exhaust opening 86 is connected in communication with a gas exhaust pipe 88 through a buffer space 87 provided in the form of an annular ring inside the side wall of the chamber 6. The gas exhaust pipe 88 is connected to an exhaust part 190. A valve 89 is inserted at some midpoint in the gas exhaust pipe 88. When the valve 89 is opened, the gas in the heat treatment space 65 is exhausted through the gas exhaust opening 86 and the buffer space 87 to the gas exhaust pipe 88. When the valve 89 is opened to only exhaust the gas from the heat treatment space 65 while the valve 84 is closed so as not to supply the treatment gas into the heat treatment space 65, the pressure in the heat treatment space 65 of the chamber 6 is reduced to less than atmospheric pressure. The at least one gas supply opening 81 and the at least one gas exhaust opening 86 may include a plurality of gas supply openings 81 and a plurality of gas exhaust openings 86, respectively, arranged in a circumferential direction of the chamber 6, and may be in the form of slits. The treatment gas supply source 85 and the exhaust part 190 may be mechanisms provided in the heat treatment apparatus 1 or be utility systems in a factory in which the heat treatment apparatus 1 is installed.

A gas exhaust pipe 191 for exhausting the gas from the heat treatment space 65 is also connected to a distal end of the transport opening 66. The gas exhaust pipe 191 is connected through a valve 192 to the exhaust part 190. By opening the valve 192, the gas in the chamber 6 is exhausted through the transport opening 66.

FIG. 2 is a perspective view showing the entire external appearance of the holder 7. The holder 7 includes a base ring 71, coupling portions 72, and the susceptor 74. The base ring 71, the coupling portions 72, and the susceptor 74 are all made of quartz. In other words, the whole of the holder 7 is made of quartz.

The base ring 71 is a quartz member having an arcuate shape obtained by removing a portion from an annular shape. This removed portion is provided to prevent interference between transfer arms 11 of the transfer mechanism 10 to be described later and the base ring 71. The base ring 71 is supported by a wall surface of the chamber 6 by being placed on the bottom surface of the recessed portion 62 (with reference to FIG. 1). The multiple coupling portions 72 (in the present preferred embodiment, four coupling portions 72) are mounted upright on the upper surface of the base ring 71 and arranged in a circumferential direction of the annular shape thereof. The coupling portions 72 are quartz members, and are rigidly secured to the base ring 71 by welding.

Figure 3:
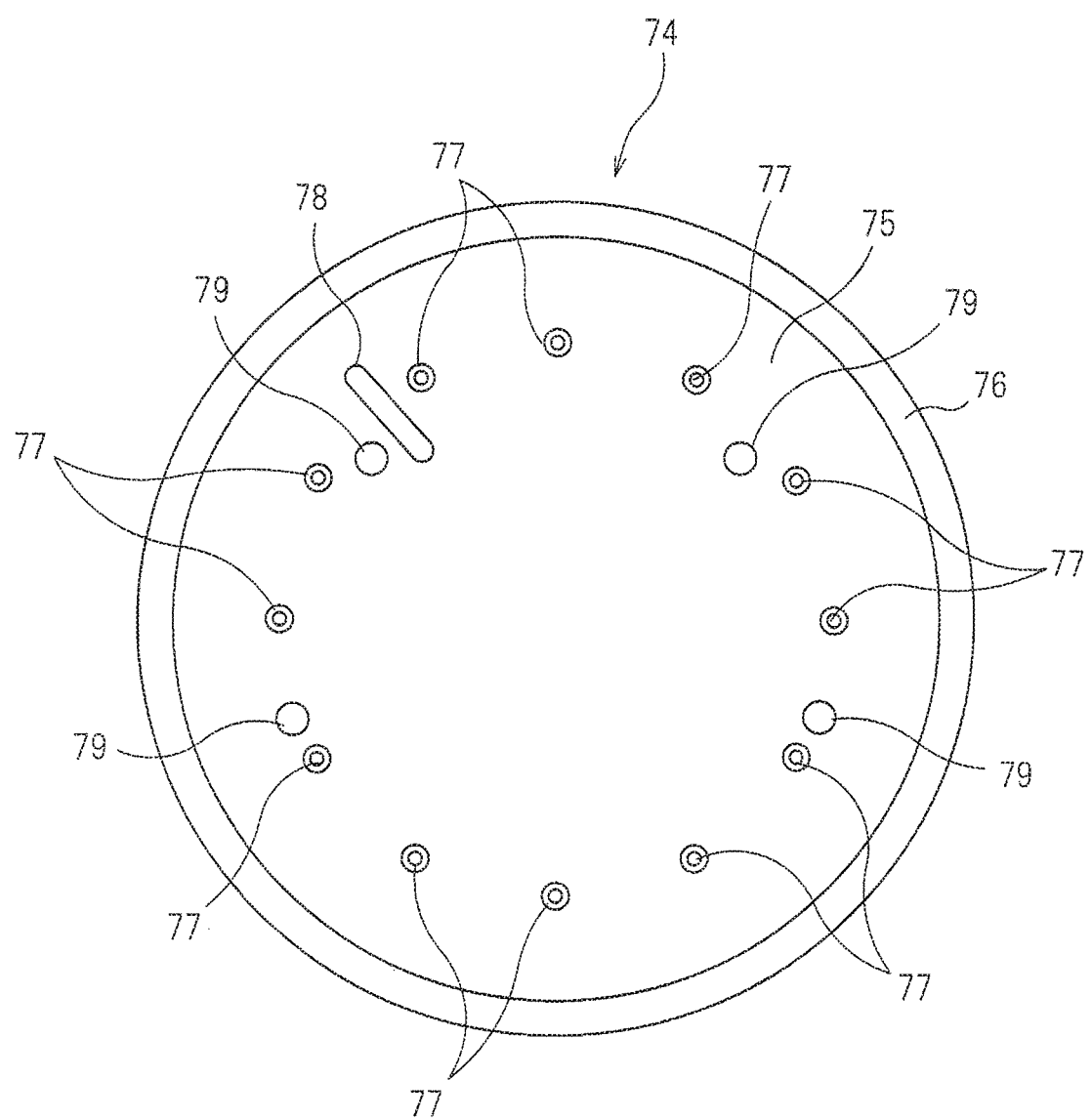
FIG. 3 is a plan view of a susceptor.
Figure 4:
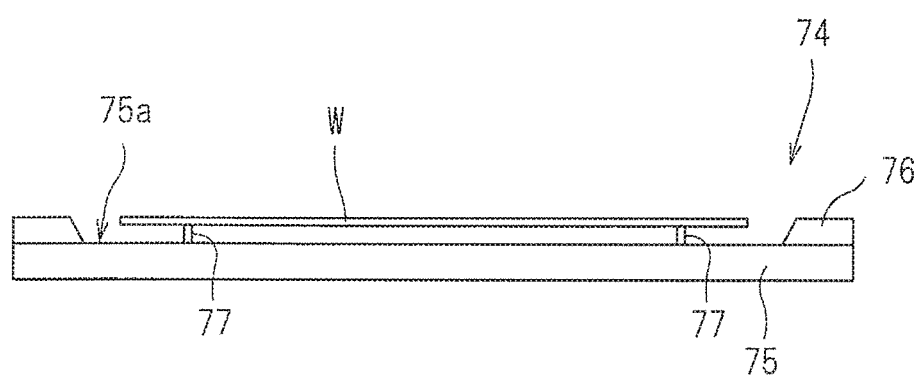
FIG. 4 is a sectional view of the susceptor.

The susceptor 74 is supported by the four coupling portions 72 provided on the base ring 71. FIG. 3 is a plan view of the susceptor 74. FIG. 4 is a sectional view of the susceptor 74. The susceptor 74 includes a holding plate 75, a guide ring 76, and a plurality of substrate support pins 77. The holding plate 75 is a generally circular planar member made of quartz. The diameter of the holding plate 75 is greater than that of a semiconductor wafer W. In other words, the holding plate 75 has a size, as seen in plan view, greater than that of the semiconductor wafer W.

The guide ring 76 is provided on a peripheral portion of the upper surface of the holding plate 75. The guide ring 76 is an annular member having an inner diameter greater than the diameter of the semiconductor wafer W. For example, when the diameter of the semiconductor wafer W is 300 mm, the inner diameter of the guide ring 76 is 320 mm. The inner periphery of the guide ring 76 is in the form of a tapered surface which becomes wider in an upward direction from the holding plate 75. The guide ring 76 is made of quartz similar to that of the holding plate 75. The guide ring 76 may be welded to the upper surface of the holding plate 75 or fixed to the holding plate 75 with separately machined pins and the like. Alternatively, the holding plate 75 and the guide ring 76 may be machined as an integral member.

A region of the upper surface of the holding plate 75 which is inside the guide ring 76 serves as a planar holding surface 75a for holding the semiconductor wafer W. The substrate support pins 77 are provided upright on the holding surface 75a of the holding plate 75. In the present preferred embodiment, a total of 12 substrate support pins 77 provided upright are spaced at intervals of 30 degrees along the circumference of a circle concentric with the outer circumference of the holding surface 75a (the inner circumference of the guide ring 76). The diameter of the circle on which the 12 substrate support pins 77 are disposed (the distance between opposed ones of the substrate support pins 77) is smaller than the diameter of the semiconductor wafer W, and is 270 to 280 mm (in the present preferred embodiment, 270 mm) when the diameter of the semiconductor wafer W is 300 mm. Each of the substrate support pins 77 is made of quartz. The substrate support pins 77 may be provided by welding on the upper surface of the holding plate 75 or machined integrally with the holding plate 75.

Referring again to FIG. 2, the four coupling portions 72 provided upright on the base ring 71 and the peripheral portion of the holding plate 75 of the susceptor 74 are rigidly secured to each other by welding. In other words, the susceptor 74 and the base ring 71 are fixedly coupled to each other with the coupling portions 72. The base ring 71 of such a holder 7 is supported by the wall surface of the chamber 6, whereby the holder 7 is mounted to the chamber 6. With the holder 7 mounted to the chamber 6, the holding plate 75 of the susceptor 74 assumes a horizontal attitude (an attitude such that the normal to the holding plate 75 coincides with a vertical direction). In other words, the holding surface 75a of the holding plate 75 becomes a horizontal surface.

A semiconductor wafer W transported into the chamber 6 is placed and supported in a horizontal attitude on the susceptor 74 of the holder 7 mounted to the chamber 6. At this time, the semiconductor wafer W is supported by the 12 substrate support pins 77 provided upright on the holding plate 75, and is held by the susceptor 74. More strictly speaking, the 12 substrate support pins 77 have respective upper end portions coming in contact with the lower surface of the semiconductor wafer W to support the semiconductor wafer W. The semiconductor wafer W is supported in a horizontal attitude by the 12 substrate support pins 77 because the 12 substrate support pins 77 have a uniform height (distance from the upper ends of the substrate support pins 77 to the holding surface 75a of the holding plate 75).

The semiconductor wafer W supported by the substrate support pins 77 is spaced a predetermined distance apart from the holding surface 75a of the holding plate 75. The thickness of the guide ring 76 is greater than the height of the substrate support pins 77. Thus, the guide ring 76 prevents the horizontal misregistration of the semiconductor wafer W supported by the substrate support pins 77.

As shown in FIGS. 2 and 3, an opening 78 is formed in the holding plate 75 of the susceptor 74 so as to extend vertically through the holding plate 75 of the susceptor 74. The opening 78 is provided for the lower radiation thermometer 20 to receive radiation (infrared radiation) emitted from the lower surface of the semiconductor wafer W. Specifically, the lower radiation thermometer 20 receives the radiation emitted from the lower surface of the semiconductor wafer W through the opening 78 and the transparent window 21 mounted to the through hole 61b in the chamber side portion 61 to measure the temperature of the semiconductor wafer W. Further, the holding plate 75 of the susceptor 74 further includes four through holes 79 bored therein and designed so that lift pins 12 of the transfer mechanism 10 to be described later pass through the through holes 79, respectively, to transfer a semiconductor wafer W.

Figure 5:
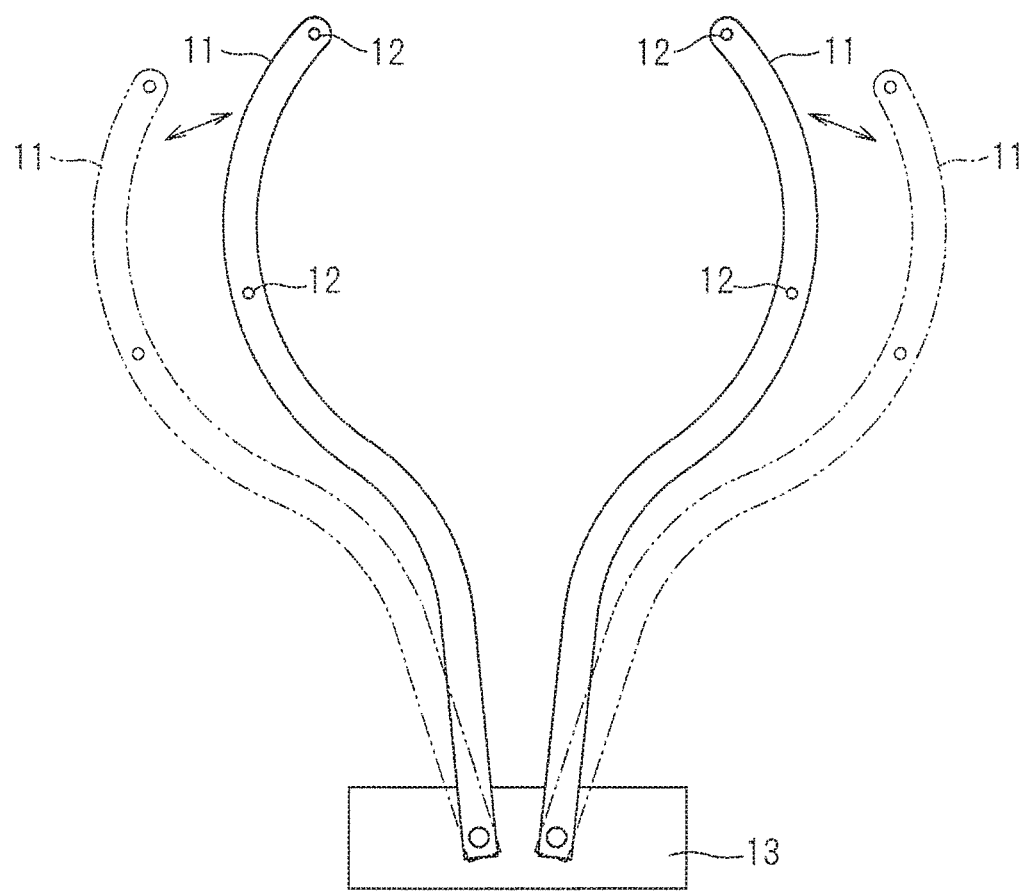
FIG. 5 is a plan view of a transfer mechanism.

FIG. 5 is a plan view of the transfer mechanism 10. FIG. 6 is a side view of the transfer mechanism 10. The transfer mechanism 10 includes the two transfer arms 11. The transfer arms 11 are of an arcuate configuration extending substantially along the annular recessed portion 62. Each of the transfer arms 11 includes the two lift pins 12 mounted upright thereon. The transfer arms 11 and the lift pins 12 are made of quartz. The transfer arms 11 are pivotable by a horizontal movement mechanism 13. The horizontal movement mechanism 13 moves the pair of transfer arms 11 horizontally between a transfer operation position (a position indicated by solid lines in FIG. 5) in which a semiconductor wafer W is transferred to and from the holder 7 and a retracted position (a position indicated by dash-double-dot lines in FIG. 5) in which the transfer arms 11 do not overlap the semiconductor wafer W held by the holder 7 as seen in plan view. The horizontal movement mechanism 13 may be of the type which causes individual motors to pivot the transfer arms 11 respectively or of the type which uses a linkage mechanism to cause a single motor to pivot the pair of transfer arms 11 in cooperative relation.

The transfer arms 11 are moved upwardly and downwardly together with the horizontal movement mechanism 13 by an elevating mechanism 14. As the elevating mechanism 14 moves up the pair of transfer arms 11 in their transfer operation position, the four lift pins 12 in total pass through the respective four through holes 79 (with reference to FIGS. 2 and 3) bored in the susceptor 74, so that the upper ends of the lift pins 12 protrude from the upper surface of the susceptor 74. On the other hand, as the elevating mechanism 14 moves down the pair of transfer arms 11 in their transfer operation position to take the lift pins 12 out of the respective through holes 79 and the horizontal movement mechanism 13 moves the pair of transfer arms 11 so as to open the transfer arms 11, the transfer arms 11 move to their retracted position. The retracted position of the pair of transfer arms 11 is immediately over the base ring 71 of the holder 7. The retracted position of the transfer arms 11 is inside the recessed portion 62 because the base ring 71 is placed on the bottom surface of the recessed portion 62. An exhaust mechanism not shown is also provided near the location where the drivers (the horizontal movement mechanism 13 and the elevating mechanism 14) of the transfer mechanism 10 are provided, and is configured to exhaust an atmosphere around the drivers of the transfer mechanism 10 to the outside of the chamber 6.

Referring again to FIG. 1, the flash heating part 5 provided over the chamber 6 includes an enclosure 51, a light source provided inside the enclosure 51 and including the multiple (in the present preferred embodiment, 30) xenon flash lamps FL, and a reflector 52 provided inside the enclosure 51 so as to cover the light source from above. The flash heating part 5 further includes a lamp light radiation window 53 mounted to the bottom of the enclosure 51. The lamp light radiation window 53 forming the floor of the flash heating part 5 is a plate-like quartz window made of quartz. The flash heating part 5 is provided over the chamber 6, whereby the lamp light radiation window 53 is opposed to the upper chamber window 63. The flash lamps FL direct flashes of light from over the chamber 6 through the lamp light radiation window 53 and the upper chamber window 63 toward the heat treatment space 65.

The flash lamps FL, each of which is a rod-shaped lamp having an elongated cylindrical shape, are arranged in a plane so that the longitudinal directions of the respective flash lamps FL are in parallel with each other along a main surface of a semiconductor wafer W held by the holder 7 (that is, in a horizontal direction). Thus, a plane defined by the arrangement of the flash lamps FL is also a horizontal plane.

Each of the xenon flash lamps FL includes a rod-shaped glass tube (discharge tube) containing xenon gas sealed therein and having positive and negative electrodes provided on opposite ends thereof and connected to a capacitor, and a trigger electrode attached to the outer peripheral surface of the glass tube. Because the xenon gas is electrically insulative, no current flows in the glass tube in a normal state even if electrical charge is stored in the capacitor. However, if a high voltage is applied to the trigger electrode to produce an electrical breakdown, electricity stored in the capacitor flows momentarily in the glass tube, and xenon atoms or molecules are excited at this time to cause light emission. Such a xenon flash lamp FL has the property of being capable of emitting extremely intense light as compared with a light source that stays lit continuously such as a halogen lamp HL because the electrostatic energy previously stored in the capacitor is converted into an ultrashort light pulse ranging from 0.1 to 100 milliseconds. Thus, the flash lamps FL are pulsed light emitting lamps which emit light instantaneously for an extremely short time period of less than one second. The light emission time of the flash lamps FL is adjustable by the coil constant of a lamp light source which supplies power to the flash lamps FL.

The reflector 52 is provided over the plurality of flash lamps FL so as to cover all of the flash lamps FL. A fundamental function of the reflector 52 is to reflect flashes of light emitted from the plurality of flash lamps FL toward the heat treatment space 65. The reflector 52 is a plate made of an aluminum alloy. A surface of the reflector 52 (a surface which faces the flash lamps FL) is roughened by abrasive blasting.

The halogen heating part 4 provided under the chamber 6 includes an enclosure 41 incorporating the multiple (in the present preferred embodiment, 40) halogen lamps HL. The halogen heating part 4 is a light irradiator that directs light from under the chamber 6 through the lower chamber window 64 toward the heat treatment space 65 to heat the semiconductor wafer W by means of the halogen lamps HL.

Figure 7:
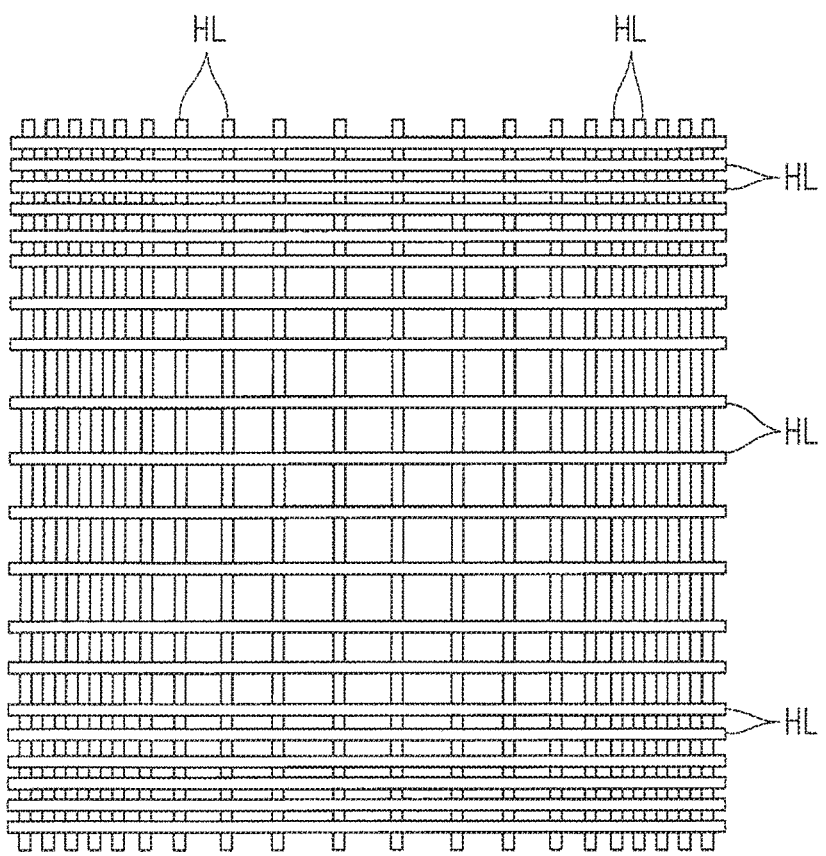
FIG. 7 is a plan view showing an arrangement of halogen lamps.

FIG. 7 is a plan view showing an arrangement of the multiple halogen lamps HL. The 40 halogen lamps HL are arranged in two tiers, i.e. upper and lower tiers. That is, 20 halogen lamps HL are arranged in the upper tier closer to the holder 7, and 20 halogen lamps HL are arranged in the lower tier farther from the holder 7 than the upper tier. Each of the halogen lamps HL is a rod-shaped lamp having an elongated cylindrical shape. The 20 halogen lamps HL in each of the upper and lower tiers are arranged so that the longitudinal directions thereof are in parallel with each other along a main surface of a semiconductor wafer W held by the holder 7 (that is, in a horizontal direction). Thus, a plane defined by the arrangement of the halogen lamps HL in each of the upper and lower tiers is also a horizontal plane.

As shown in FIG. 7, the halogen lamps HL in each of the upper and lower tiers are disposed at a higher density in a region opposed to the peripheral portion of the semiconductor wafer W held by the holder 7 than in a region opposed to the central portion thereof. In other words, the halogen lamps HL in each of the upper and lower tiers are arranged at shorter intervals in the peripheral portion of the lamp arrangement than in the central portion thereof. This allows a greater amount of light to impinge upon the peripheral portion of the semiconductor wafer W where a temperature decrease is prone to occur when the semiconductor wafer W is heated by the irradiation thereof with light from the halogen heating part 4.

The group of halogen lamps HL in the upper tier and the group of halogen lamps HL in the lower tier are arranged to intersect each other in a lattice pattern. In other words, the 40 halogen lamps HL in total are disposed so that the longitudinal direction of the 20 halogen lamps HL arranged in the upper tier and the longitudinal direction of the 20 halogen lamps HL arranged in the lower tier are orthogonal to each other.

Each of the halogen lamps HL is a filament type light source which passes current through a filament disposed in a glass tube to make the filament incandescent, thereby emitting light. A gas prepared by introducing a halogen element (iodine, bromine and the like) in trace amounts into an inert gas such as nitrogen, argon and the like is sealed in the glass tube. The introduction of the halogen element allows the temperature of the filament to be set at a high temperature while suppressing a break in the filament. Thus, the halogen lamps HL have the properties of having a longer life than typical incandescent lamps and being capable of continuously emitting intense light. That is, the halogen lamps HL are continuous lighting lamps that emit light continuously for not less than one second. In addition, the halogen lamps HL, which are rod-shaped lamps, have a long life. The arrangement of the halogen lamps HL in a horizontal direction provides good efficiency of radiation toward the semiconductor wafer W provided over the halogen lamps HL.

A reflector 43 is provided also inside the enclosure 41 of the halogen heating part 4 under the halogen lamps HL arranged in two tiers (FIG. 1). The reflector 43 reflects the light emitted from the halogen lamps HL toward the heat treatment space 65.

Figure 8:
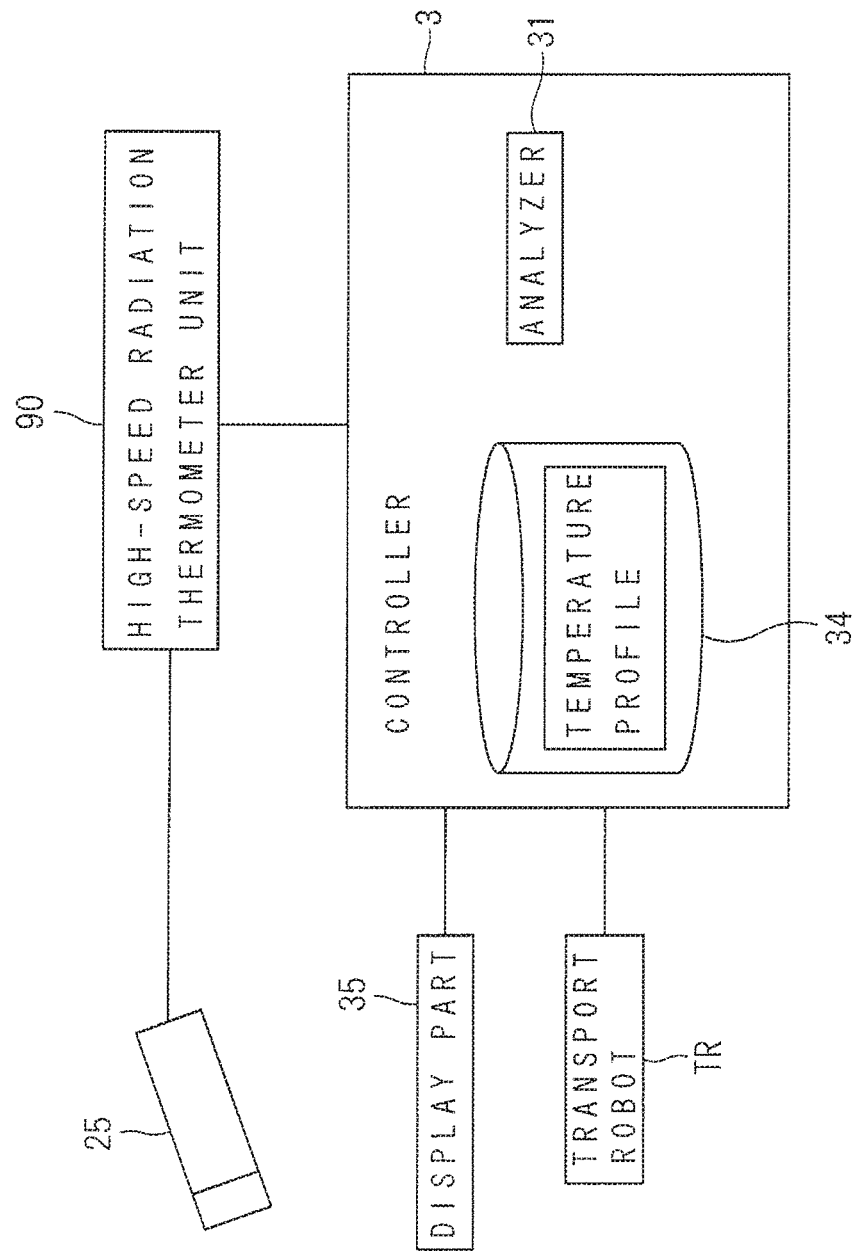
FIG. 8 is a block diagram showing a configuration of a temperature measuring mechanism including an upper radiation thermometer.

The controller 3 controls the aforementioned various operating mechanisms provided in the heat treatment apparatus 1. The controller 3 is similar in hardware configuration to a typical computer. Specifically, the controller 3 includes a CPU that is a circuit for performing various computation processes, a ROM or read-only memory for storing a basic program therein, a RAM or readable/writable memory for storing various pieces of information therein, and a magnetic disk 34 for storing control software, data and the like thereon (FIG. 8). The CPU in the controller 3 executes a predetermined processing program, whereby the processes in the heat treatment apparatus 1 proceed.

As shown in FIG. 1, the heat treatment apparatus 1 includes the upper radiation thermometer 25 and the lower radiation thermometer 20. The upper radiation thermometer 25 is a high-speed radiation thermometer for measuring abrupt changes in temperature of the upper surface of the semiconductor wafer W at the instant of irradiation with flashes of light from the flash lamps FL.

FIG. 8 is a block diagram showing a configuration of a temperature measuring mechanism including the upper radiation thermometer 25. The upper radiation thermometer 25 is mounted at an oblique angle to an outer wall surface of the chamber side portion 61 so that the optical axis thereof coincides with the longitudinal axis of the through hole 61a. The upper radiation thermometer 25 receives infrared radiation emitted from the upper surface of the semiconductor wafer W held by the susceptor 74 and passing through the transparent window 26 made of calcium fluoride. The upper radiation thermometer 25 includes an optical element made of InSb (indium antimonide) and has a measurable wavelength range of 5 to 6.5 μm. The transparent window 26 made of calcium fluoride allows infrared radiation in the wavelength range measurable with the upper radiation thermometer 25 to selectively pass therethrough. The optical element made of InSb has a resistance varying according to the intensity of the received infrared radiation. The upper radiation thermometer 25 including the optical element made of InSb is capable of high-speed measurement that is extremely short in response time and pronouncedly short in sampling time intervals (e.g., approximately 40 microseconds). The upper radiation thermometer 25 is electrically connected to a high-speed radiation thermometer unit 90, and transmits a signal generated in response to received light to the high-speed radiation thermometer unit 90.

The high-speed radiation thermometer unit 90 includes an amplifier circuit, an A/D converter, and the like (which are not shown), and performs a predetermined computation process on the signal transmitted from the upper radiation thermometer 25 to convert the processed signal into a temperature. The temperature determined by the high-speed radiation thermometer unit 90 is the temperature of the upper surface of the semiconductor wafer W. In the present preferred embodiment, the upper radiation thermometer 25 and the high-speed radiation thermometer unit 90 constitute a temperature measuring part for measuring a front surface temperature of the semiconductor wafer W. The lower radiation thermometer 20 is substantially similar in configuration to the upper radiation thermometer 25 but may be incapable of high-speed radiation measurement.

As shown in FIG. 8, the high-speed radiation thermometer unit 90 is electrically connected to the controller 3 that is the controller for the entire heat treatment apparatus 1. The temperature of the upper surface of the semiconductor wafer W which is determined by the high-speed radiation thermometer unit 90 is transmitted to the controller 3. The controller 3 stores the temperature data transmitted from the high-speed radiation thermometer unit 90 onto the magnetic disk 34. The controller 3 sequentially accumulates the temperature data sampled at regular time intervals by the upper radiation thermometer 25 and the high-speed radiation thermometer unit 90 onto the magnetic disk 34 to thereby acquire a temperature profile representing changes in temperature of the upper surface of the semiconductor wafer W with time.

The controller 3 further includes an analyzer 31. The analyzer 31 is a functional processing part implemented by the CPU in the controller 3 executing a predetermined processing program. The details on the processing in the analyzer 31 will be further described later.

A display part 35 is also connected to the controller 3. The display part 35 is a display panel of a liquid crystal display device or the like provided on an outer wall of the heat treatment apparatus 1, for example. The controller 3 causes a variety of pieces of information to appear on the display part 35. Further, the controller 3 controls a transport robot TR for transporting a semiconductor wafer W into and out of the chamber 6.

The heat treatment apparatus 1 further includes, in addition to the aforementioned components, various cooling structures to prevent an excessive temperature rise in the halogen heating part 4, the flash heating part 5, and the chamber 6 because of the heat energy generated from the halogen lamps HL and the flash lamps FL during the heat treatment of a semiconductor wafer W. As an example, a water cooling tube (not shown) is provided in the walls of the chamber 6. Also, the halogen heating part 4 and the flash heating part 5 have an air cooling structure for forming a gas flow therein to exhaust heat. Air is supplied to a gap between the upper chamber window 63 and the lamp light radiation window 53 to cool down the flash heating part 5 and the upper chamber window 63.

Figure 9:
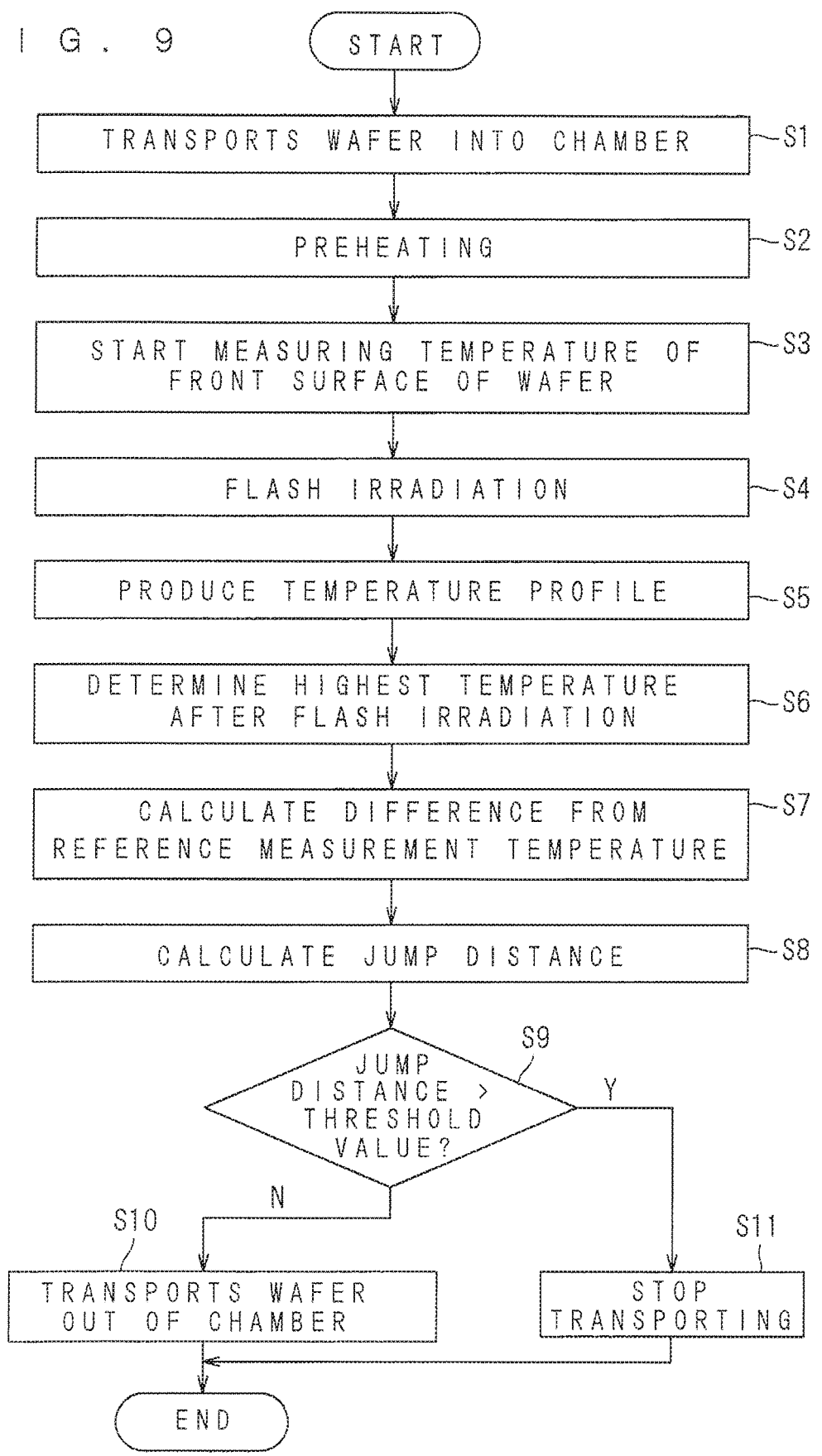
FIG. 9 is a flow diagram showing a procedure for treatment of a semiconductor wafer.

Next, a procedure for the treatment of a semiconductor wafer W in the heat treatment apparatus 1 will be described. FIG. 9 is a flow diagram showing the procedure for the treatment of the semiconductor wafer W. A semiconductor wafer W to be treated herein is a semiconductor substrate doped with impurities (ions) by an ion implantation process. The impurities are activated by the heat treatment apparatus 1 performing the process of heating (annealing) the semiconductor wafer W by irradiation with a flash of light. The procedure for the treatment in the heat treatment apparatus 1 which will be described below proceeds under the control of the controller 3 over the operating mechanisms of the heat treatment apparatus 1.

First, the valve 84 is opened for supply of gas, and the valves 89 and 192 for exhaust of gas are opened, so that the supply and exhaust of gas into and out of the chamber 6 start. When the valve 84 is opened, nitrogen gas is supplied through the gas supply opening 81 into the heat treatment space 65. When the valve 89 is opened, the gas within the chamber 6 is exhausted through the gas exhaust opening 86. This causes the nitrogen gas supplied from an upper portion of the heat treatment space 65 in the chamber 6 to flow downwardly and then to be exhausted from a lower portion of the heat treatment space 65.

The gas within the chamber 6 is exhausted also through the transport opening 66 by opening the valve 192. Further, the exhaust mechanism not shown exhausts an atmosphere near the drivers of the transfer mechanism 10. It should be noted that the nitrogen gas is continuously supplied into the heat treatment space 65 during the heat treatment of a semiconductor wafer W in the heat treatment apparatus 1. The amount of nitrogen gas supplied into the heat treatment space 65 is changed as appropriate in accordance with process steps.

Subsequently, the gate valve 185 is opened to open the transport opening 66. The transport robot TR (with reference to FIG. 8) transports a semiconductor wafer W to be treated through the transport opening 66 into the heat treatment space 65 of the chamber 6 (Step S1). At this time, there is a danger that an atmosphere outside the heat treatment apparatus 1 is carried into the heat treatment space 65 as the semiconductor wafer W is transported into the heat treatment space 65. However, because the nitrogen gas is continuously supplied in the chamber 6, the nitrogen gas flows outwardly through the transport opening 66 to minimize the outside atmosphere carried into the heat treatment space 65.

The semiconductor wafer W transported into the heat treatment space 65 by the transport robot TR is moved forward to a position lying immediately over the holder 7 and is stopped thereat. Then, the pair of transfer arms 11 of the transfer mechanism 10 is moved horizontally from the retracted position to the transfer operation position and is then moved upwardly, whereby the lift pins 12 pass through the through holes 79 and protrude from the upper surface of the holding plate 75 of the susceptor 74 to receive the semiconductor wafer W. At this time, the lift pins 12 move upwardly to above the upper ends of the substrate support pins 77.

After the semiconductor wafer W is placed on the lift pins 12, the transport robot TR moves out of the heat treatment space 65, and the gate valve 185 closes the transport opening 66. Then, the pair of transfer arms 11 moves downwardly to transfer the semiconductor wafer W from the transfer mechanism 10 to the susceptor 74 of the holder 7, so that the semiconductor wafer W is held in a horizontal attitude from below. The semiconductor wafer W is supported by the substrate support pins 77 provided upright on the holding plate 75, and is held by the susceptor 74. The semiconductor wafer W is held by the holder 7 in such an attitude that the front surface thereof patterned and implanted with impurities is the upper surface. A predetermined distance is defined between the back surface (a main surface opposite from the front surface) of the semiconductor wafer W supported by the substrate support pins 77 and the holding surface 75a of the holding plate 75. The pair of transfer arms 11 moved downwardly below the susceptor 74 is moved back to the retracted position, i.e. to the inside of the recessed portion 62, by the horizontal movement mechanism 13.

After the semiconductor wafer W is supported in a horizontal attitude from below by the susceptor 74 of the holder 7 made of quartz, the 40 halogen lamps HL in the halogen heating part 4 turn on simultaneously to start preheating (or assist-heating) (Step S2). Halogen light emitted from the halogen lamps HL is transmitted through the lower chamber window 64 and the susceptor 74 both made of quartz, and impinges upon the lower surface of the semiconductor wafer W. By receiving halogen light irradiation from the halogen lamps HL, the semiconductor wafer W is preheated, so that the temperature of the semiconductor wafer W increases. It should be noted that the transfer arms 11 of the transfer mechanism 10, which are retracted to the inside of the recessed portion 62, do not become an obstacle to the heating using the halogen lamps HL.

The temperature of the semiconductor wafer W is measured with the lower radiation thermometer 20 when the halogen lamps HL perform the preheating. Specifically, the lower radiation thermometer 20 receives infrared radiation emitted from the lower surface of the semiconductor wafer W held by the susceptor 74 through the opening 78 and passing through the transparent window 21 to measure the temperature of the semiconductor wafer W which is on the increase. The measured temperature of the semiconductor wafer W is transmitted to the controller 3. The controller 3 controls the output from the halogen lamps HL while monitoring whether the temperature of the semiconductor wafer W which is on the increase by the irradiation with light from the halogen lamps HL reaches a predetermined preheating temperature T1 or not. In other words, the controller 3 effects feedback control of the output from the halogen lamps HL so that the temperature of the semiconductor wafer W is equal to the preheating temperature T1, based on the value measured with the lower radiation thermometer 20. In this manner, the lower radiation thermometer 20 is a radiation thermometer for controlling the temperature of the semiconductor wafer W during the preheating. The preheating temperature T1 shall be on the order of 200° to 800° C., preferably on the order of 350° to 600° C., (in the present preferred embodiment, 600° C.) at which there is no apprehension that the impurities implanted in the semiconductor wafer W are diffused by heat.

After the temperature of the semiconductor wafer W reaches the preheating temperature T1, the controller 3 maintains the temperature of the semiconductor wafer W at the preheating temperature T1 for a short time. Specifically, at the point in time when the temperature of the semiconductor wafer W measured with the lower radiation thermometer 20 reaches the preheating temperature T1, the controller 3 adjusts the output from the halogen lamps HL to maintain the temperature of the semiconductor wafer W at approximately the preheating temperature T1.

By performing such preheating using the halogen lamps HL, the temperature of the entire semiconductor wafer W is uniformly increased to the preheating temperature T1. In the stage of preheating using the halogen lamps HL, the semiconductor wafer W shows a tendency to be lower in temperature in a peripheral portion thereof where heat dissipation is liable to occur than in a central portion thereof. However, the halogen lamps HL in the halogen heating part 4 are disposed at a higher density in the region opposed to the peripheral portion of the semiconductor wafer W than in the region opposed to the central portion thereof. This causes a greater amount of light to impinge upon the peripheral portion of the semiconductor wafer W where heat dissipation is liable to occur, thereby providing a uniform in-plane temperature distribution of the semiconductor wafer W in the stage of preheating.

After the temperature of the semiconductor wafer W reaches the preheating temperature T1 and immediately before (e.g., tens of microseconds before) the flash irradiation from the flash lamps FL is performed, the measurement of the front surface temperature of the semiconductor wafer W by means of the upper radiation thermometer 25 is started (Step S3). Infrared radiation having an intensity depending on the temperature of the front surface of the semiconductor wafer W is emitted from the front surface of the semiconductor wafer W to be heated. The infrared radiation emitted from the front surface of the semiconductor wafer W is transmitted through the transparent window 26 and is received by the upper radiation thermometer 25.

The upper radiation thermometer 25 receives the infrared radiation emitted from the front surface of the semiconductor wafer W to be heated, and the high-speed radiation thermometer unit 90 measures the front surface temperature of the semiconductor wafer W, based on the intensity of the infrared radiation. The upper radiation thermometer 25 is a high-speed radiation thermometer employing the InSb optical element, and the high-speed radiation thermometer unit 90 measures the front surface temperature of the semiconductor wafer W at ultrashort sampling time intervals of 40 microseconds. Then, the high-speed radiation thermometer unit 90 sequentially transmits data about the front surface temperature of the semiconductor wafer W measured at regular time intervals to the controller 3.

The flash lamps FL in the flash heating part 5 irradiate the front surface of the semiconductor wafer W supported by the susceptor 74 with a flash of light at the point in time when a predetermined time period has elapsed since the temperature of the semiconductor wafer W reached the preheating temperature T1 (Step S4). At this time, part of the flash of light emitted from the flash lamps FL travels directly toward the interior of the chamber 6. The remainder of the flash of light is reflected once from the reflector 52, and then travels toward the interior of the chamber 6. The irradiation of the semiconductor wafer W with such flashes of light achieves the flash heating of the semiconductor wafer W.

The flash heating, which is achieved by the emission of a flash of light from the flash lamps FL, is capable of increasing the front surface temperature of the semiconductor wafer W in a short time. Specifically, the flash of light emitted from the flash lamps FL is an intense flash of light emitted for an extremely short period of time ranging from about 0.1 to about 100 milliseconds as a result of the conversion of the electrostatic energy previously stored in the capacitor into such an ultrashort light pulse. The front surface temperature of the semiconductor wafer W subjected to the flash heating by the flash irradiation from the flash lamps FL momentarily increases to a treatment temperature T2 of 1000° C. or higher. After the impurities implanted in the semiconductor wafer W are activated, the front surface temperature of the semiconductor wafer W decreases rapidly. Because of the capability of increasing and decreasing the front surface temperature of the semiconductor wafer W in an extremely short time, the heat treatment apparatus 1 achieves the activation of the impurities implanted in the semiconductor wafer W while suppressing the diffusion of the impurities due to heat. It should be noted that the time required for the activation of the impurities is extremely short as compared with the time required for the thermal diffusion of the impurities. Thus, the activation is completed in a short time ranging from about 0.1 to about 100 milliseconds during which no diffusion occurs.

The front surface temperature of the semiconductor wafer W is being measured by means of the upper radiation thermometer 25 and the high-speed radiation thermometer unit 90 when the front surface temperature of the semiconductor wafer W is increased and decreased rapidly by the flash heating. The upper radiation thermometer 25 and the high-speed radiation thermometer unit 90 are capable of keeping up with abrupt changes, if any, in front surface temperature of the semiconductor wafer W during the flash irradiation because the upper radiation thermometer 25 and the high-speed radiation thermometer unit 90 measure the front surface temperature of the semiconductor wafer W at ultrashort sampling time intervals of 40 microseconds. For example, even if the front surface temperature of the semiconductor wafer W is increased or decreased in 4 milliseconds, the high-speed radiation thermometer unit 90 is capable of acquiring 100 temperature data during that time period. The upper radiation thermometer 25 and the high-speed radiation thermometer unit 90 measure the front surface temperature of the semiconductor wafer W to transmit the temperature data to the controller 3 for a previously set predetermined time period (e.g., 120 milliseconds) after the flash lamps FL emit a flash of light. The temperature data transmitted from the high-speed radiation thermometer unit 90 are sequentially accumulated on the magnetic disk 34, whereby a temperature profile representing changes in front surface temperature of the semiconductor wafer W with time before and after the flash irradiation is acquired (Step S5).

Figure 10:
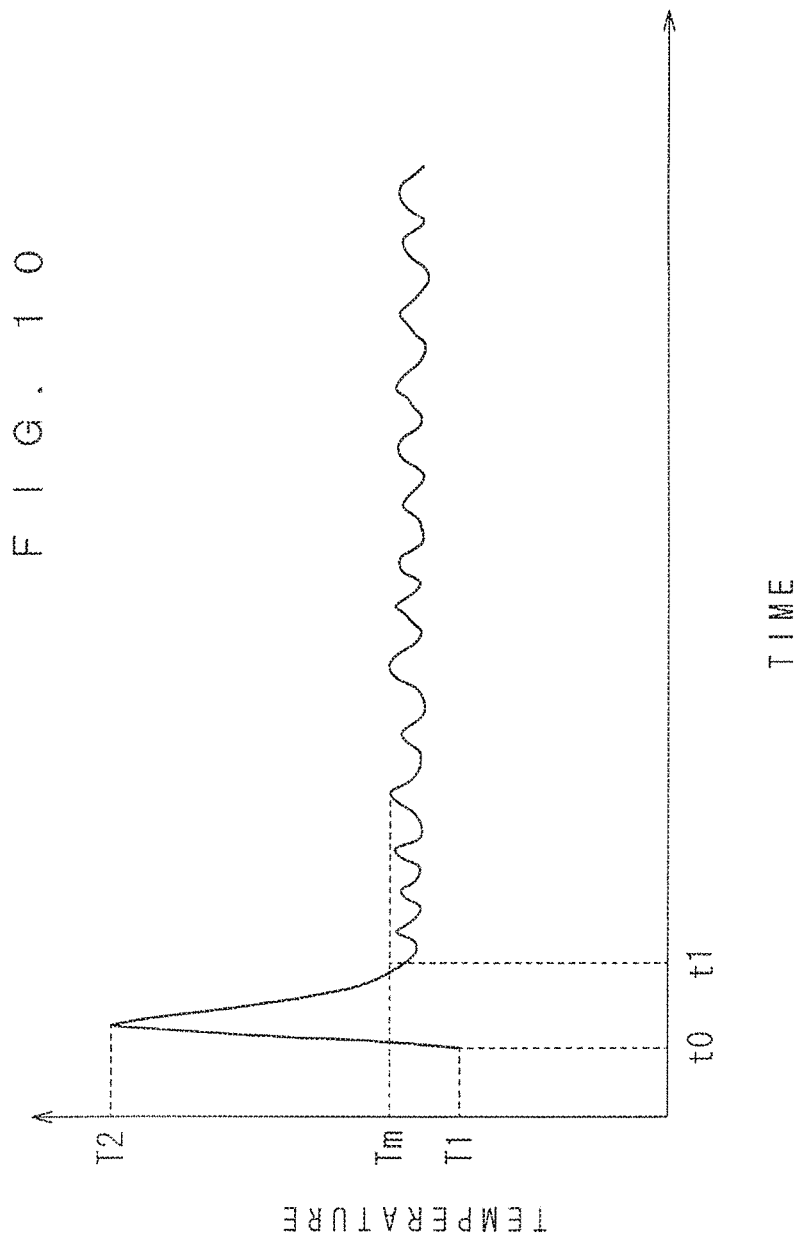
FIG. 10 is a graph showing an example of a temperature profile of a front surface temperature of a semiconductor wafer during flash irradiation.

FIG. 10 is a graph showing an example of the temperature profile of the front surface temperature of the semiconductor wafer W during the flash irradiation. At time time t0, a flash of light is emitted from the flash lamps FL to impinge upon the front surface of the semiconductor wafer W, so that the front surface temperature of the semiconductor wafer W increases momentarily from the preheating temperature T1 to the treatment temperature T2 and then decreases rapidly. Thereafter, as shown in FIG. 10, the measured temperature of the front surface of the semiconductor wafer W fluctuates with a small amplitude. Such small fluctuations in the measured temperature is considered to result from vibrations or jumping of the semiconductor wafer W on the susceptor 74 after the flash irradiation. Specifically, a flash of light extremely short in irradiation time and having ultrahigh energy impinges upon the front surface of the semiconductor wafer W during the flash irradiation. Thus, the temperature of the front surface of the semiconductor wafer W is increased momentarily to the treatment temperature T2 of 1000° C. or higher, whereas the temperature of the back surface thereof does not increase so high from the preheating temperature T1. This causes abrupt thermal expansion of only the front surface of the semiconductor wafer W, but little thermal expansion of the back surface thereof occurs. As a result, the semiconductor wafer W is warped momentarily in such a manner that the front surface of the semiconductor wafer W becomes a convex surface. In the next moment, the semiconductor wafer W is deformed in such a manner that the warped semiconductor wafer W straightens out. By repeating such behavior, the semiconductor wafer W vibrates on the susceptor 74. If the vibrations are large, there are cases in which the semiconductor wafer W jumps up from the susceptor 74.

The upper radiation thermometer 25 is provided obliquely above the semiconductor wafer W (with reference to FIG. 1). For this reason, the apparent emissivity of the front surface of the semiconductor wafer W as viewed from the upper radiation thermometer 25 fluctuates when the semiconductor wafer W vibrates or jumps up. As a result, the temperature measured with the upper radiation thermometer 25 fluctuates in small amounts. Although the temperature measured with the upper radiation thermometer 25 fluctuates due to the vibrations or jumping of the semiconductor wafer W, the actual front surface temperature of the semiconductor wafer W does not fluctuate.

After the temperature profile as shown in FIG. 10 is acquired, the analyzer 31 in the controller 3 analyzes the behavior of the semiconductor wafer W subjected to the flash irradiation, based on the temperature profile. Specifically, the analyzer 31 initially determines the highest measurement temperature Tm measured after the flash irradiation from the temperature profile (Step S6). Although the highest measurement temperature in the entire temperature profile is the treatment temperature T2 reached by the front surface of the semiconductor wafer W due to the flash irradiation, the analyzer 31 determines the highest measurement temperature Tm after time t1 that is a predetermined time period later than the time t0 at which the flash lamps FL emit light in the temperature profile. The aforementioned predetermined time period from the time t0 to the time t1 is set to 20 milliseconds, for example. The analyzer 31 excludes the time period of 20 milliseconds after the time to at which the flash lamps FL emit light from the analysis range, and determines the highest measurement temperature Tm in the range of the temperature profile after the time t1. During a lapse of 20 milliseconds after the emission of light from the flash lamps FL, the front surface temperature of the semiconductor wafer W momentarily increases to the treatment temperature T2 and decreases to near the preheating temperature T1. That is, the analyzer 31 excludes the substantial increase in temperature of the front surface of the semiconductor wafer W due to the flash irradiation, and determines the highest measurement temperature Tm in the range in which the temperature of the front surface of the semiconductor wafer W decreases to near the preheating temperature T1 and then varies after the flash irradiation.

Figure 11:
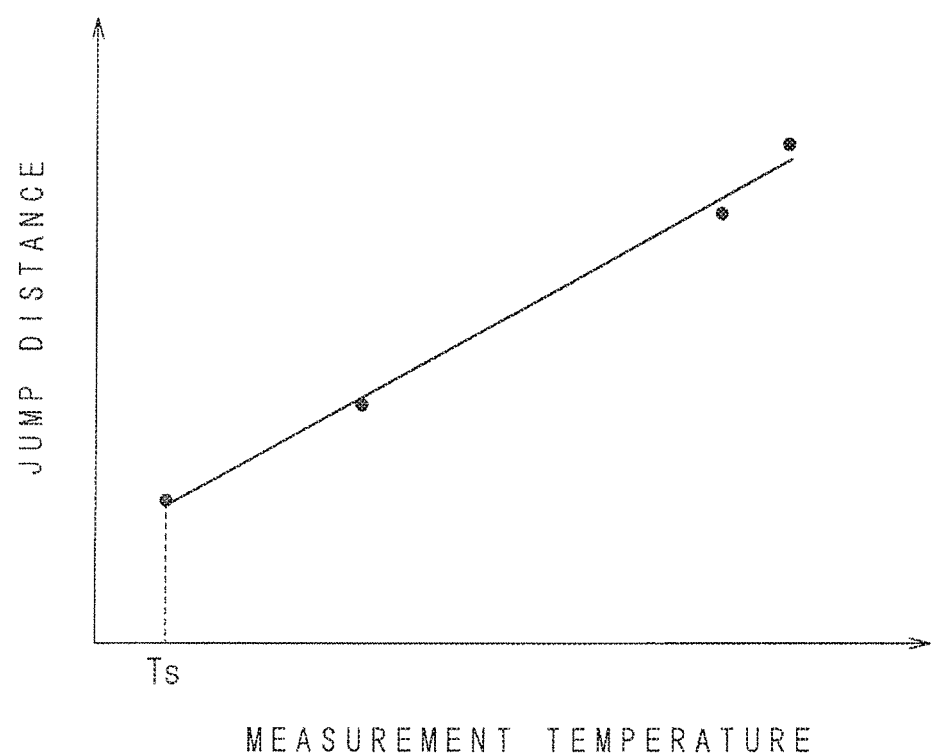
FIG. 11 is a graph showing a correlation between the highest measurement temperature and a jump distance of the semiconductor wafer subjected to the flash irradiation.

If the halogen lamps HL and the flash lamps FL are subject to the light emission conditions and the preheating temperature T1 and the treatment temperature T2 are the same, it can be said that the semiconductor wafer W vibrates and jumps up more severely as the highest measurement temperature Tm is higher in a qualitative manner. FIG. 11 is a graph showing a correlation between the highest measurement temperature Tm and a jump distance (the amount of jumping) of the semiconductor wafer W subjected to the flash irradiation. The graph shown in FIG. 11 is based on the premise that the halogen lamps HL and the flash lamps FL are subject to the same light emission conditions and the preheating temperature T1 and the treatment temperature T2 are the same.

As shown in FIG. 11, as the highest measurement temperature Tm after the time t1 later than the flash irradiation increases, the jump distance of the semiconductor wafer W from the susceptor 74 increases. A difference in the jump distance of the semiconductor wafer W in spite of the same light emission conditions of the halogen lamps HL and the flash lamps FL typically results from a difference in pressure in the chamber 6. As the pressure in the chamber 6 decreases, the jump distance of the semiconductor wafer W increases and the highest measurement temperature Tm accordingly increases even if the halogen lamps HL and the flash lamps FL are subject to the same light emission conditions. This phenomenon is considered to result from the decrease in force that suppresses the jumping of the semiconductor wafer W with the decrease in pressure in the chamber 6.

The highest measurement temperature Tm of the semiconductor wafer W which is measured when the pressure in the chamber 6 is equal to a reference pressure (e.g., substantially ordinary pressure of 100000 Pa) shall be defined as a reference measurement temperature Ts. Then, a difference $\Delta T$ between the highest measurement temperature Tm and the reference measurement temperature Ts of the semiconductor wafer W being treated has a linear correlation with the jump distance of the semiconductor wafer W. In the present preferred embodiment, the analyzer 31 determines the highest measurement temperature Tm of the semiconductor wafer W being treated, and thereafter calculates the difference $\Delta T$ between the highest measurement temperature Tm and the reference measurement temperature Ts (Step S7). Then, the analyzer 31 calculates the jump distance of the semiconductor wafer W from the susceptor 74, based on the difference $\Delta T$ (Step S8). Specifically, a table showing the correlation between the difference $\Delta T$ and the jump distance of the semiconductor wafer W derived from the correlation shown in FIG. 11, for example, is produced and stored in a storage portion (e.g., the magnetic disk 34) of the controller 3. The controller 3 determines the jump distance of the semiconductor wafer W from the table.

Next, the procedure proceeds to Step S9. In Step S9, a judgment is made as to whether the jump distance of the semiconductor wafer W calculated by the analyzer 31 is greater than a predetermined threshold value or not. If the jump distance of the semiconductor wafer W is not greater than the predetermined threshold value, the procedure proceeds to Step S10. In Step S10, the process of transporting the semiconductor wafer W to the outside is performed. Specifically, after a predetermined time period has elapsed since the completion of the flash heating treatment, the halogen lamps HL turn off. This causes the temperature of the semiconductor wafer W to decrease rapidly from the preheating temperature T1. The lower radiation thermometer 20 measures the temperature of the semiconductor wafer W which is on the decrease. The result of measurement is transmitted to the controller 3. The controller 3 monitors whether the temperature of the semiconductor wafer W is decreased to a predetermined temperature or not, based on the result of measurement with the lower radiation thermometer 20. After the temperature of the semiconductor wafer W is decreased to the predetermined temperature or below, the pair of transfer arms 11 of the transfer mechanism 10 is moved horizontally again from the retracted position to the transfer operation position and is then moved upwardly, so that the lift pins 12 protrude from the upper surface of the susceptor 74 to receive the heat-treated semiconductor wafer W from the susceptor 74. Subsequently, the transport opening 66 which has been closed is opened by the gate valve 185, and the transport robot TR transports the semiconductor wafer W placed on the lift pins 12 to the outside. Thus, the heat treatment apparatus 1 completes the heating treatment of the semiconductor wafer W.

On the other hand, if the jump distance of the semiconductor wafer W is greater than the predetermined threshold value, the procedure proceeds to Step S11. In Step S11, the controller 3 stops the transport of the semiconductor wafer W out of the chamber 6. When the semiconductor wafer W jumps up and then falls onto the susceptor 74 after the flash irradiation, the position of the semiconductor wafer W is often displaced from its original set position (the initial position of the semiconductor wafer W transported into the chamber 6 and supported by the susceptor 74). The amount of such displacement increases as the jump distance of the semiconductor wafer W increases. If the semiconductor wafer W is displaced, for example, 15 mm or more from its original set position, the transport robot TR is not able to properly hold and transport the semiconductor wafer W to the outside. This might result in trouble with the transport robot TR itself, depending on the circumstances. To prevent this, if the jump distance of the semiconductor wafer W is greater than the predetermined threshold value, the controller 3 stops the process of transporting the semiconductor wafer W to the outside to prevent transport trouble, thereby preventing damages to the semiconductor wafer W and the transport robot TR. Alternatively, the controller 3 may issue an alarm to the display part 35 and the like if the jump distance of the semiconductor wafer W is greater than the predetermined threshold value. If the jump distance of the semiconductor wafer W is not greater than the predetermined threshold value, the amount of displacement of the semiconductor wafer W is small and falls within an allowable range of the transport robot TR, so that the transport robot TR is able to perform the process of transporting the semiconductor wafer W to the outside in Step S10.

In the present preferred embodiment, the temperature profile is acquired by measuring the temperature of the front surface of the semiconductor wafer W after the flash irradiation, and the highest measurement temperature Tm of the semiconductor wafer W subjected to the flash irradiation is determined from the temperature profile. Then, the jump distance of the semiconductor wafer W is calculated based on the difference $\Delta T$ between the reference measurement temperature Ts obtained when the pressure in the chamber 6 is equal to the reference pressure and the highest measurement temperature Tm.

The upper radiation thermometer 25 and the high-speed radiation thermometer unit 90 both for measuring the temperature of the front surface of the semiconductor wafer W are originally provided for the purpose of measuring the attained surface temperature (in the present preferred embodiment, the treatment temperature T2) of the semiconductor wafer W at the time of the flash irradiation. That is, the jump distance of the semiconductor wafer W is calculated through the use of the mechanism for measuring the attained surface temperature of the semiconductor wafer W. Thus, there is no need to obtain new space for placement of the upper radiation thermometer 25 and the high-speed radiation thermometer unit 90 in the heat treatment apparatus 1. Also, the radiation thermometer is a less expensive measuring device than a high-speed camera and the like. Further, the analysis of the temperature profile is significantly simpler than the analysis of image data in the high-speed camera, and is achieved in a shorter time. Therefore, the technique according to the present invention is capable of quickly grasping the behavior of the semiconductor wafer W subjected to the flash irradiation with a simplified configuration.

While the preferred embodiment according to the present invention has been described hereinabove, various modifications of the present invention in addition to those described above may be made without departing from the scope and spirit of the invention. For example, the jump distance is calculated as the behavior of the semiconductor wafer W in the aforementioned preferred embodiment. The present invention, however, is not limited to this. The analyzer 31 may calculate other indicators from the temperature profile. When the semiconductor wafer W subjected to the flash irradiation jumps up from the susceptor 74 while assuming a horizontal attitude without being inclined, the periodicity and amplitude of vibrations of the semiconductor wafer W are associated with the periodicity and amplitude of variations in measurement temperature on the temperature profile. In such cases, the analyzer 31 may hence determine the periodicity and amplitude of vibrations of the semiconductor wafer W from the periodicity and amplitude variations in measurement temperature appearing on the temperature profile.

In the aforementioned preferred embodiment, the measurement of the front surface temperature of the semiconductor wafer W by means of the upper radiation thermometer 25 is started immediately before the flash irradiation from the flash lamps FL. However, the measurement by means of the upper radiation thermometer 25 may be started prior to the start of the preheating by means of the halogen lamps HL or at the same time as the light emission from the flash lamps FL. In short, the temperature of the semiconductor wafer W at least after the irradiation with flashes of light from the flash lamps FL may be measured by means of the upper radiation thermometer 25, whereby the temperature profile is acquired.

Although the 30 flash lamps FL are provided in the flash heating part 5 according to the aforementioned preferred embodiment, the present invention is not limited to this. Any number of flash lamps FL may be provided. The flash lamps FL are not limited to the xenon flash lamps, but may be krypton flash lamps. Also, the number of halogen lamps HL provided in the halogen heating part 4 is not limited to 40. Any number of halogen lamps HL may be provided.

In the aforementioned preferred embodiment, the filament-type halogen lamps HL are used as continuous lighting lamps that emit light continuously for not less than one second to preheat the semiconductor wafer W. The present invention, however, is not limited to this. In place of the halogen lamps HL, discharge type arc lamps may be used as continuous lighting lamps to preheat the semiconductor wafer W. Alternatively, the susceptor for holding the semiconductor wafer W thereon may be placed on a hot plate, and the semiconductor wafer W may be preheated by heat conduction from the hot plate.

Moreover, a substrate to be treated by the heat treatment apparatus 1 is not limited to a semiconductor wafer, but may be a glass substrate for use in a flat panel display for a liquid crystal display apparatus and the like, and a substrate for a solar cell. Also, the technique according to the present invention may be applied to the heat treatment of high dielectric constant gate insulator films (high-k films), to the joining of metal and silicon, and to the crystallization of polysilicon.

While the invention has been described in detail, the foregoing description is in all aspects illustrative and not restrictive. It is understood that numerous other modifications and variations can be devised without departing from the scope of the invention.

What is claimed is:

1. A method of heating a substrate by irradiating the substrate with a flash of light, said method comprising the steps of:
    (a) irradiating a front surface of a substrate supported by a susceptor in a chamber with a flash of light from a flash lamp, wherein partial thermal expansion occurs in the substrate due to the flash of light, causing the substrate to vibrate, and the vibration causes the substrate to bounce on the susceptor, creating a distance between said substrate and said susceptor;
    (b) measuring a temperature of the front surface of said substrate at least after the irradiation with said flash of light to acquire a temperature profile of the front surface of said substrate;
    (c) determining a highest measurement temperature in said temperature profile; and
    (d) calculating the distance between said substrate and said susceptor when the substrate has the highest measurement temperature,
    wherein in said step (d), the distance between said substrate and said susceptor is calculated based on a table showing a correlation between (1) a difference between the highest measurement temperature of said substrate and a reference measurement temperature and (2) the distance between said substrate and said susceptor, and
    wherein a highest measurement temperature of a reference substrate measured when a pressure in said chamber is equal to a reference pressure is set as the reference measurement temperature.

2. The method according to claim 1, wherein transport of said substrate out of said chamber is stopped when the distance calculated in said step (d) is greater than a predetermined threshold value.

3. A heat treatment apparatus for heating a substrate by irradiating the substrate with a flash of light, comprising:
    a chamber for receiving a substrate therein;
    a susceptor for placing and supporting said substrate thereon in said chamber;
    a flash lamp for irradiating said substrate supported by said susceptor with a flash of light, wherein partial thermal expansion occurs in the substrate due to the flash of light, causing the substrate to vibrate, and the vibration causes the substrate to bounce on the susceptor, creating a distance between said substrate and said susceptor;
    a temperature measuring part for measuring a temperature of a front surface of said substrate;
    an analyzer for determining a highest measurement temperature in a temperature profile acquired from the temperature of the front surface of said substrate measured by said temperature measuring part at least after the irradiation with said flash of light and calculating the distance between said substrate and said susceptor when the substrate has the highest measurement temperature; and a storage that stores a table showing a correlation between (1) a difference between the highest measurement temperature of said substrate and a reference measurement temperature and (2) the distance between said substrate and said susceptor, wherein a highest measurement temperature of a reference substrate measured when a pressure in said chamber is equal to a reference pressure is set as the reference measurement temperature, and wherein the analyzer calculates the distance between said substrate and said susceptor based on said table.

4. The heat treatment apparatus according to claim 3, further comprising a controller that stops transport of said substrate out of said chamber when the distance calculated by said analyzer is greater than a predetermined threshold value.

* * * * *